(12) United States Patent
Mori et al.

(10) Patent No.: US 6,750,724 B1
(45) Date of Patent: Jun. 15, 2004

(54) MULTISTAGE AMPLIFIER

(75) Inventors: Kazutomi Mori, Tokyo (JP); Shintarou Shinjo, Tokyo (JP); Yukio Ikeda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/110,200

(22) PCT Filed: Aug. 28, 2000

(86) PCT No.: PCT/JP00/05799

§ 371 (c)(1),
(2), (4) Date: Apr. 17, 2002

(87) PCT Pub. No.: WO02/19518

PCT Pub. Date: Mar. 7, 2002

(51) Int. Cl.[7] .................................................. H03F 3/04
(52) U.S. Cl. ....................................... 330/310; 330/150
(58) Field of Search ................................ 330/133, 150, 330/285, 296, 310

(56) References Cited

U.S. PATENT DOCUMENTS

| 4,532,477 | A | | 7/1985 | Green, Jr. et al. ........... 330/296 |
|---|---|---|---|---|
| 5,408,198 | A | * | 4/1995 | Kusunoki .................... 330/310 |
| 5,455,968 | A | * | 10/1995 | Pham ......................... 330/285 |
| 5,757,236 | A | * | 5/1998 | Ortiz et al. .................. 330/296 |
| 5,815,038 | A | | 9/1998 | Ogura et al. ................. 330/296 |
| 5,942,946 | A | * | 8/1999 | Su et al. ...................... 330/285 |
| 5,986,503 | A | * | 11/1999 | Ichikawa ..................... 330/296 |
| 6,172,567 | B1 | * | 1/2001 | Ueno et al. .................. 330/285 |
| 6,204,731 | B1 | * | 3/2001 | Jiang et al. .................. 330/310 |
| 6,278,328 | B1 | * | 8/2001 | Yamamoto et al. .......... 330/310 |
| 6,559,722 | B1 | * | 5/2003 | Lopez et al. ................. 330/296 |

FOREIGN PATENT DOCUMENTS

| JP | 6-69731 | 3/1994 |
|---|---|---|
| JP | 7-245529 | 9/1995 |
| JP | 2000-183663 | 6/2000 |

* cited by examiner

*Primary Examiner*—Khanh Van Nguyen
(74) *Attorney, Agent, or Firm*—Oblon, Spivak, McClelland, Maier & Neustadt, P.C.

(57) ABSTRACT

A bias condition of at least one amplifier among amplifiers other than a last-stage amplifier is set in consideration of the relation between an idle current and a saturation current.

3 Claims, 5 Drawing Sheets

(a)

Gain=Gain1×Gain2×Gain3
Phase=Phase1+Phase2+Phase3

(b-1)

(b-2)

(c)

(d)

(b-3)

—·—·— OPERATION LEVEL

MULTISTAGE AMPLIFIER

TECHNICAL FIELD

The present invention relates to a quasilinear multistage amplifier used for satellite communications, terrestrial microwave communications, mobile communications and the like, which satisfies specifications on distortion.

BACKGROUND ART

Multistage amplifiers used for satellite communications, terrestrial microwave communications, mobile communications and the like are generally required to have low distortion, for digital modulation and multicarrier common amplification.

Further, amplifiers, which are among wireless apparatus of largest power consumption, are also required to operate with high efficiency and lower power consumption. Therefore, it is necessary to improve the distortion characteristics of amplifiers by using distortion compensation circuits and make it possible to operate near the saturation region for high-efficiency operation.

FIG. 1 is a block diagram showing a conventional multistage amplifier disclosed, for example, in Japanese Patent Application Laid Open No. 60-157305. In this figure, reference numeral 1 denotes an input terminal, reference numeral 2 denotes a distortion compensation circuit for compensating distortion of an amplifier 3, reference numeral 3 denotes a single-stage or multistage amplifier, reference numeral 4 denotes an output terminal, reference numeral 5 denotes an amplifier incorporating a bias circuit (hereinafter referred to as "bias-circuit incorporated amplifier) for adjusting the amount of distortion of an input signal, and reference numeral 6 denotes a gallium arsenide (GaAs) field effect transistor (FET) whose idle current is set in a range from 0.1 Idss to 0.75 Idss. Reference sign Idss represents a saturation current of the GaAs FET 6. Reference numeral 7 denotes an attenuator for adjusting the signal level of the input signal.

Next, an operation will be discussed.

There arises distortion in a signal amplified by the amplifier 3 due to nonlinear gain characteristic (AM-AM characteristic) and phase characteristic (AM-PM characteristic) of the amplifier 3.

Generally, the AM-AM characteristic of the amplifier 3 is gain reduction with respect to input power or output power and the AM-PM characteristic thereof is phase lead with respect to the input power or output power.

Therefore, if the distortion compensation circuit 2 generates a distortion characteristic reverse to the AM-AM characteristic and AM-PM characteristic of the amplifier 3, it is possible to compensate the distortion of the input signal.

FIG. 2 is a graph illustrating the dependencies of AM-AM characteristic and AM-PM characteristic on idle currents Ido.

It can be seen from FIG. 2 that by changing the bias condition from class A to class AB, the phase characteristic changes from phase lead to phase lag with respect to the output power.

In the conventional case, the bias condition is set such that the idle current Ido should be in a range from 0.1 Idss to 0.75 Idss. If the idle current Ido is not more than the upper limit of 0.75 Idss, a characteristic of phase lag with respect to the output power is obtained. On the other hand, if the idle current Ido is not less than the lower limit of 0.1 Idss, almost constant characteristic without gain increase with respect to the output power is obtained.

Therefore, the amplifier 5 incorporating the bias circuit which sets the bias condition such that the idle current Ido should be in the range from 0.1 Idss to 0.75 Idss has the AM-AM characteristic of almost constant gain with respect to the output power and the AM-PM characteristic of phase lag with respect thereto.

Thus, since the distortion compensation circuit 2 which includes the bias-circuit incorporated amplifier 5 has a characteristic of almost constant gain and phase lag with respect to the output power, it can improve only the phase characteristic without deteriorating the gain characteristic of the amplifier 3 under distortion compensation.

Further, since the distortion compensation circuit 2 includes a plurality of bias-circuit incorporated amplifier 5 and attenuators 7, it is possible to appropriately adjust the characteristic of the distortion compensation circuit 2 to the reverse characteristic of the amplifier 3.

The conventional multistage amplifier, having the above-discussed constitution, has a problem that the distortion compensation circuit 2 should be disadvantageously upsized as it includes the attenuators 7 and that the gain of the distortion compensation circuit 2 becomes lower. Further, since only the phase characteristic is improved as distortion, it is disadvantageously impossible to achieve a large distortion compensation effect including the gain characteristic.

The present invention has been provided to solve the above problems, and an object of the present invention is to provide a multistage amplifier which can achieve a large distortion compensation effect without upsizing or gain reduction.

DISCLOSURE OF THE INVENTION

In a multistage amplifier of the present invention, a bias condition of at least one amplifier among amplifiers other than a last-stage amplifier is set in consideration of the relation between an idle current and a saturation current.

This produces a large distortion compensation effect without upsizing or gain reduction.

In the multistage amplifier of the present invention, the bias condition of the amplifier is set such that the idle current should be less than a tenth of the saturation current.

This produces a large distortion compensation effect.

In the multistage amplifier of the present invention, the gate width of the amplifier whose bias condition is set such that the idle current should be less than a tenth of the saturation current is set in such a manner that the gate width of the last-stage amplifier and the gate width of the amplifier can satisfy a predetermined condition.

This produces an effect of achieving a multistage amplifier of high efficiency and low distortion.

In the multistage amplifier of the present invention, assuming that the gate width of the last-stage amplifier is Wgn, the gate width of an i-th amplifier whose bias condition is set such that the idle current should be less than a tenth of the saturation current is Wgi, and the gain of an (i+1)-th amplifier through the last-stage amplifier is G, the gate width of the i-th amplifier is so set as to satisfy the following relation:

$$Wgi > 2.4 \times Wgn/G$$

This produces an effect of improving the efficiency of the multistage amplifier.

BEST MODE FOR CARRYING OUT THE INVENTION

For more detailed description of the present invention, the best mode for carrying out the present invention will be discussed below, referring to attached figures.

First Embodiment

Figure 1:
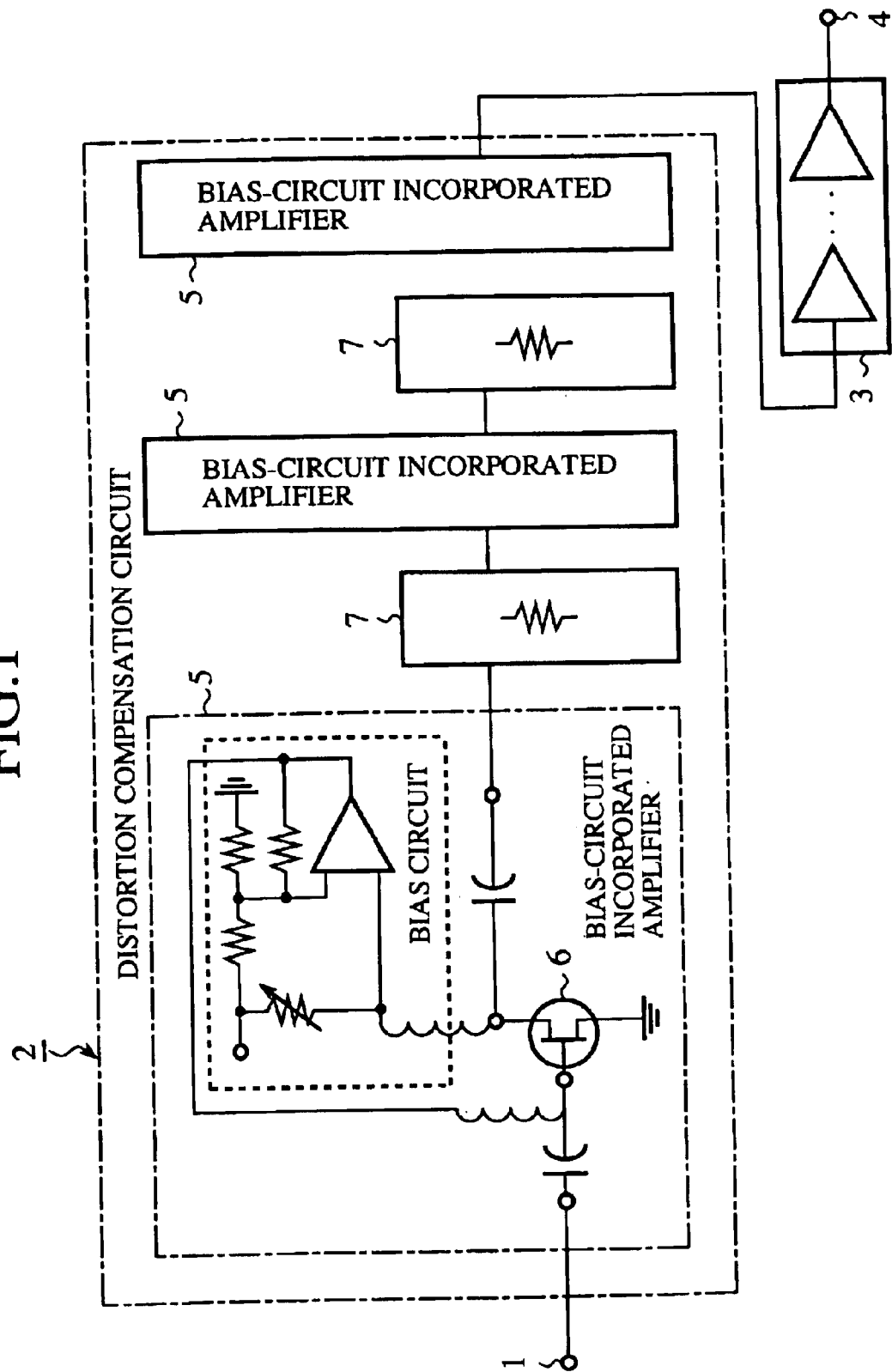
FIG. 1 is a block diagram showing a conventional multistage amplifier.
Figure 2:
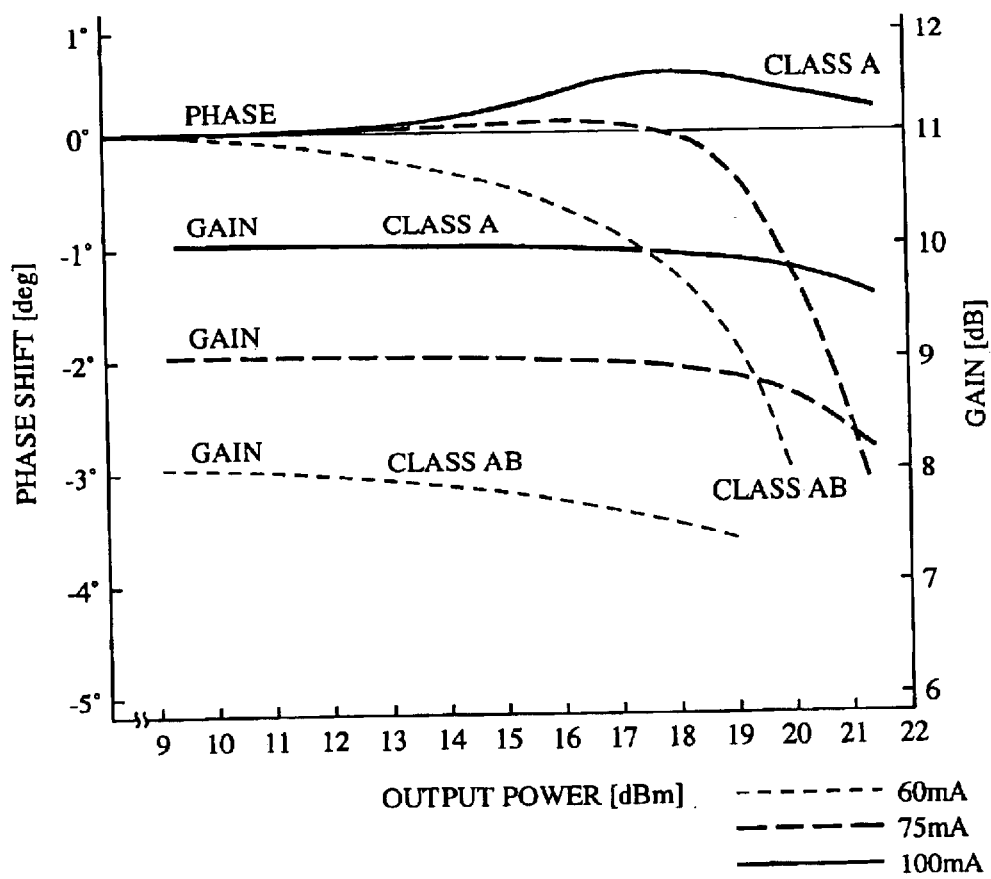
FIG. 2 is a graph illustrating the dependencies of AM-AM characteristic and AM-PM characteristic on idle currents Ido.
Figure 3:
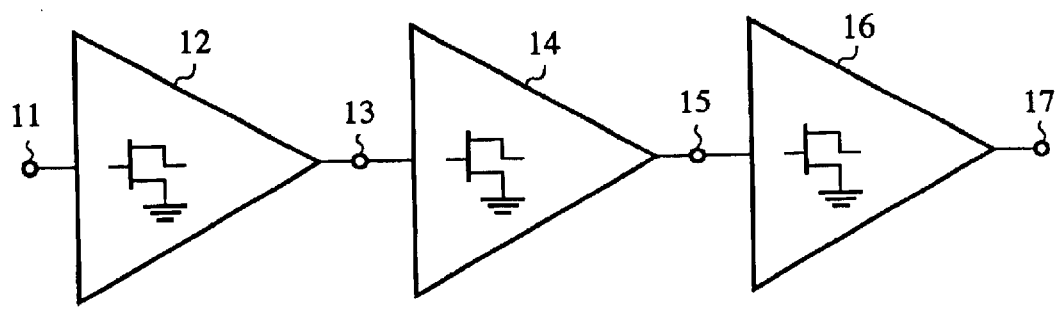
FIG. 3 is a block diagram showing a multistage amplifier according to a first predetermined of the present invention.

FIG. 3 is a block diagram showing a multistage amplifier according to the first embodiment of the present invention. In this figure, reference numeral 11 denotes an input terminal, reference numeral 12 denotes a first-stage amplifier constituted essentially of an amplifier element such as GaAs FET or HEMT (High Electron Mobility Transistor), a gate bias circuit, a drain bias circuit, a matching circuit and the like, reference numeral 13 denotes a terminal between the first-stage amplifier 12 and a second-stage amplifier 14, reference numeral 14 denotes a second-stage amplifier like the first-stage amplifier 12, reference numeral 15 denotes a terminal between the second-stage amplifier 14 and a last-stage amplifier 16, and reference numeral 16 denotes a last-stage amplifier like the first-stage amplifier 12.

The bias condition of the first-stage amplifier 12 is set such that the idle current Ido should be less than a tenth of the saturation current Idss.

Next, an operation will be discussed.

Figure 4:
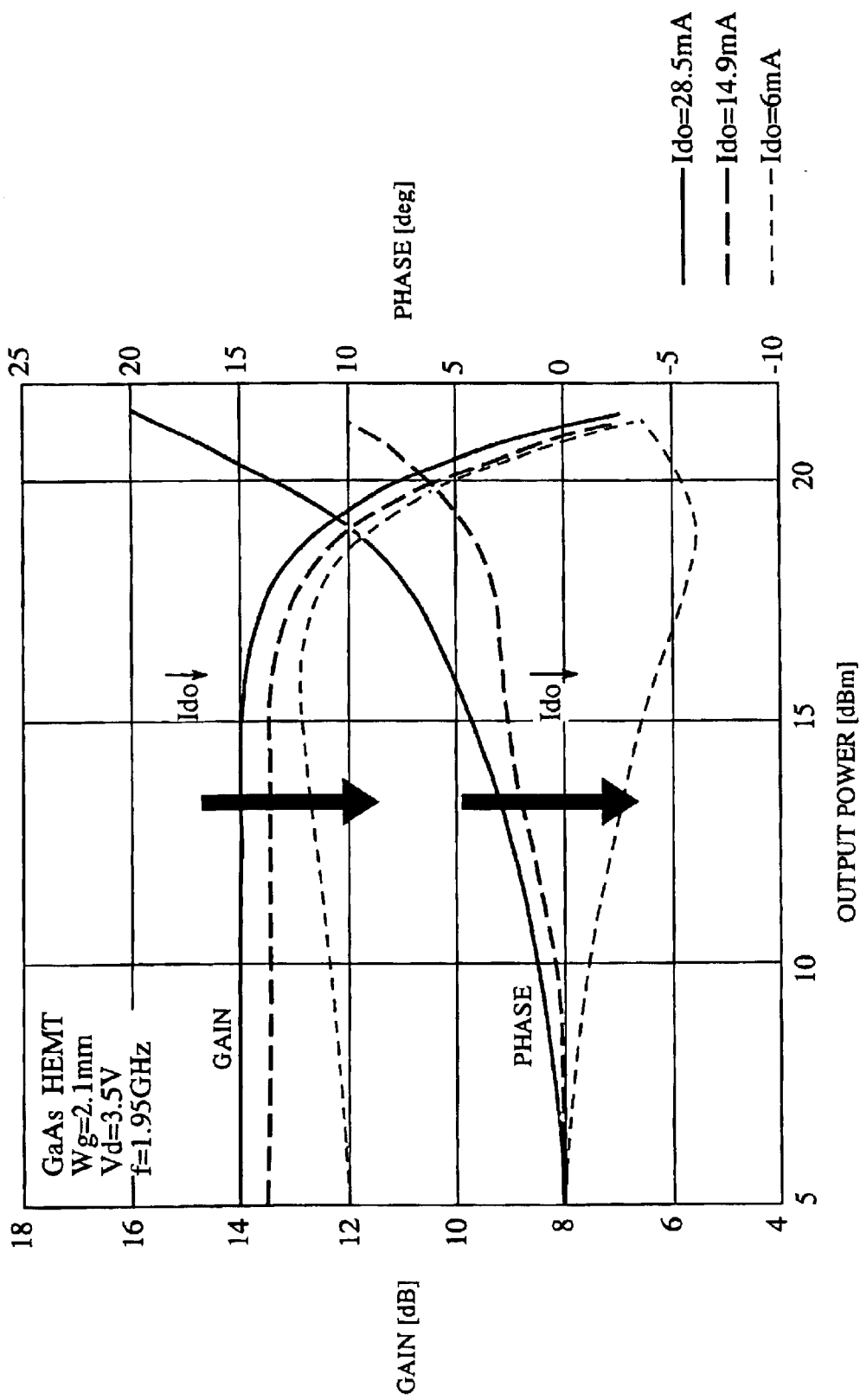
FIG. 4 is a graph illustrating the dependencies of AM-AM characteristic and AM-PM characteristic on idle currents Ido.

FIG. 4 is a graph illustrating the dependencies of AM-AM characteristic and AM-PM characteristic on idle currents Ido.

The amplifier element used for the measurement is a GaAs HEMT having a gate width of 2.1 mm and the graph shows a result of evaluation under the frequency of 1.95 GHz. It can be seen, as a result, that by reducing the idle current until Ido<0.1 Idss, a gain characteristic where the gain once increases and then decreases with respect to the input power is obtained. It can be further seen that by reducing the idle current to near class B operation, a phase characteristic of phase lag with respect to the input power is obtained.

Therefore, when the idle current Ido is set below 0.1 Idss as the bias condition of the first-stage amplifier 12, the first-stage amplifier 12 achieves a characteristic where the gain once increases and then decreases and the phase lags with respect to the input power. The reason why the above characteristic is obtained as the bias class is made closer to class B is as follows.

When the bias condition is class A, the gain monotonously decreases as the mutual conductance gm monotonously decreases with respect to the input power, but when the bias condition becomes closer to class B, the gain assumes such a characteristic as once increases and then decreases as the mutual conductance gm of a transistor once increases and then decreases.

Next, discussion will be made on the principle on which the distortion of the last-stage amplifier 16 can be compensated by setting the bias condition of the first-stage amplifier 12 such that the idle current Ido<0.1 Idss.

First, the input power, the output power, the gain and the phase are defined as shown in FIG. 5(a) Specifically, in the first-stage amplifier 12, the input power is Pin1, the output power is Pout1, the gain is Gain1 and the phase is Phase1. In the second-stage amplifier 14, the input power is Pin2, the output power is Pout2, the gain is Gain2 and the phase is Phase2. In the last-stage amplifier 16, the input power is Pin3, the output power is Pout3, the gain is Gain3 and the phase is Phase3. In the multistage amplifier on the whole, the input power is Pin, the output power is Pout, the gain is Gain and the phase is Phase.

The gain Gain of the multistage amplifier is obtained by Gain1×Gain2×Gain3, and the phase Phase is obtained by Phase1+Phase2+Phase3.

Figure 5:
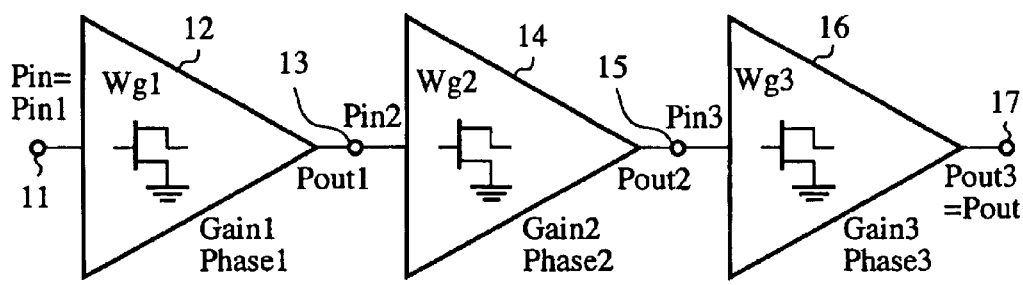
FIG. 5 is an illustration showing the principle of distortion compensation.
Figure 5:
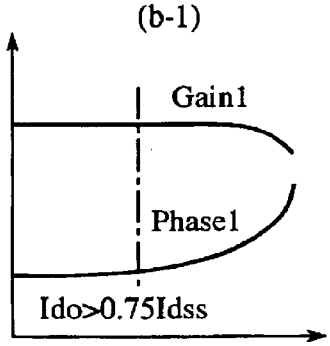
Figure 5:
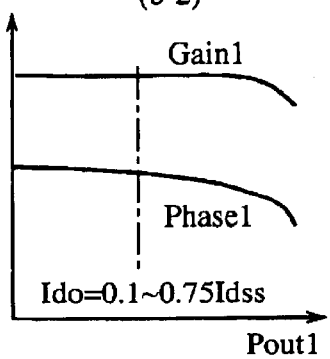
Figure 5:
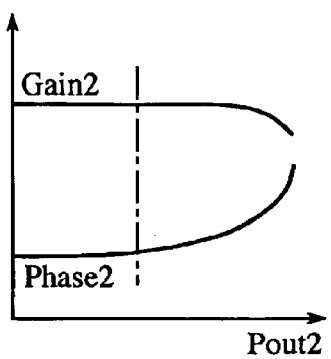
Figure 5:
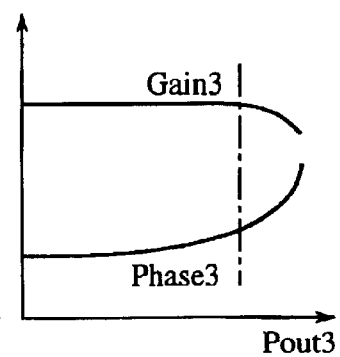
Figure 5:
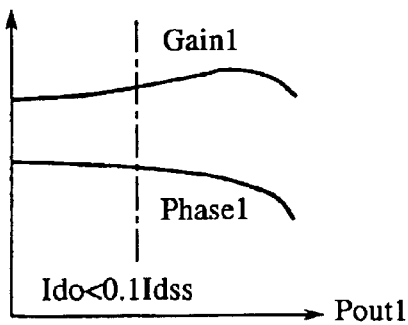

FIG. 5(b-1) shows a gain characteristic and a phase characteristic under the bias condition of the first-stage amplifier 12 where Ido>0.75 Idss, FIG. 5(b-2) shows a gain characteristic and a phase characteristic under the bias condition of the first-stage amplifier 12 where Ido=0.1 to 0.75 Idss, and FIG. 5(b-3) shows a gain characteristic and a phase characteristic under the bias condition of the first-stage amplifier 12 where Ido<0.1 Idss. Further, in these figures, the alternate long and short dash lines represent operation output levels of respective-stage amplifiers.

In multistage amplifiers having specification on distortion characteristic, generally, the operation level of the second-stage amplifier 14 (see FIG. 5(c)) has more backoff than that of the last-stage amplifier 16 (see FIG. 5(d)) such that the distortion of the second-stage amplifier 14 should be smaller than that of the last-stage amplifier 16. Usually, the backoff of the second-stage amplifier 14 is larger than that of the last-stage amplifier 16 by about 2 to 3 dB.

The bias condition of the first-stage amplifier 12 is generally the same as that of the last-stage amplifier 16, i.e., as shown in FIG. 5(b-1). Like in the second-stage amplifier 14, the operation level of the first-stage amplifier 12 has more backoff than that of the last-stage amplifier 16.

Next, the bias condition of the earlier-discussed conventional one (distortion compensation circuit) is as shown in FIG. 3(b-2). The gain characteristic continues to be almost constant with respect to the input power and then the gain decreases due to saturation. The phase characteristic shows that the phase lags with respect to the input power.

At last, FIG. 5(b-3) shows the bias condition of the first-stage amplifier 12 in the first embodiment. The first-stage amplifier 12 has a characteristic where the gain once increases and then decreases and the phase lags with respect to the input power. In any case, the operation level of the first-stage amplifier 12 is set to a level lower than a point where the gain decreases.

Figure 6:
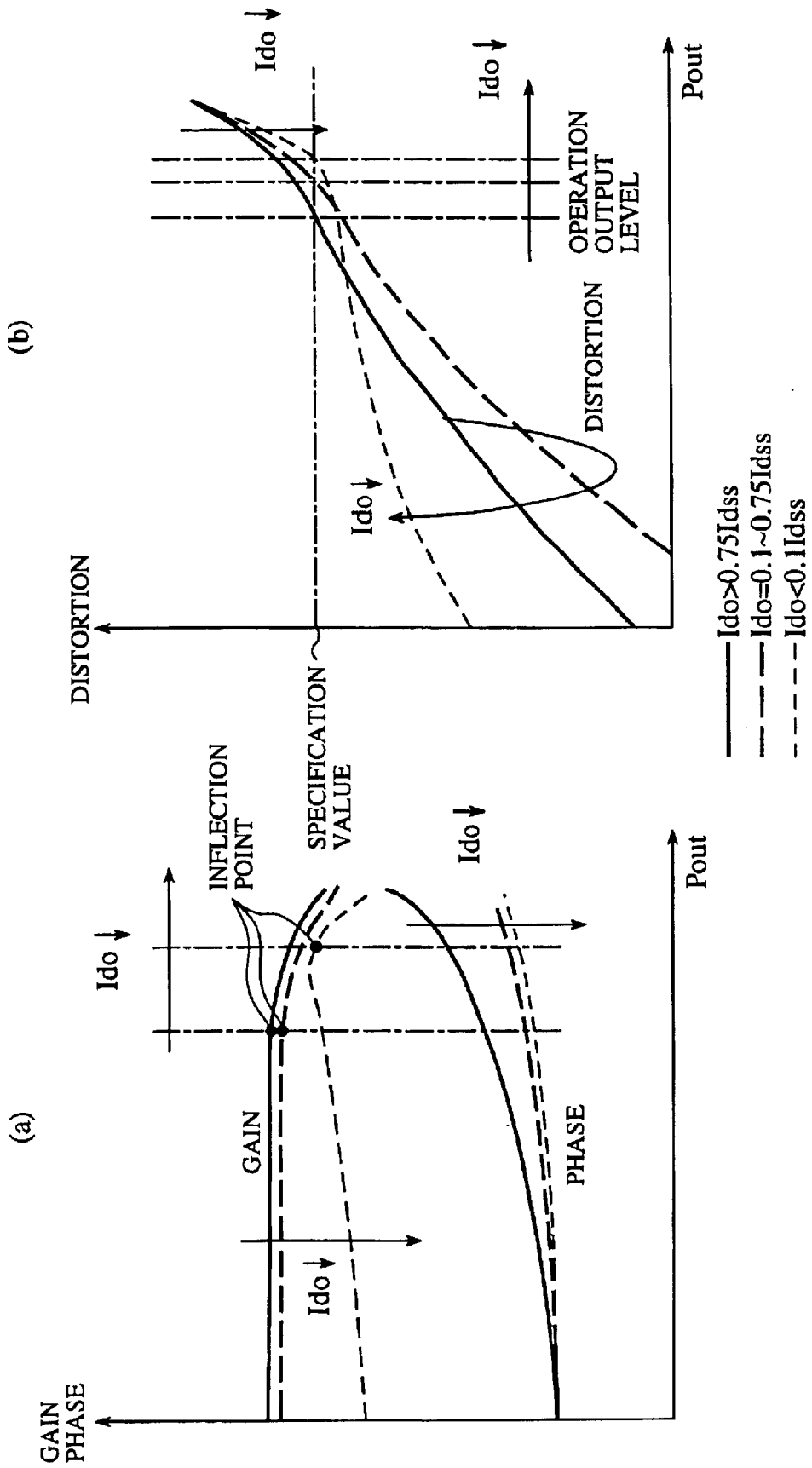
FIG. 6 is a graph showing the gain characteristic, phase characteristic and distortion characteristic of the multistage amplifier as a whole.

FIG. 6(a) shows a gain characteristic and a phase characteristic of the multistage amplifier on the whole when the first-stage amplifier 12 is under the above bias condition, and FIG. 6(b) schematically shows distortion characteristics such as IMD (Inter Modulation Distortion), ACPR (Adjacent Channel Leakage Power Ratio) and NPR (Noise Power Ratio).

In these figures, the solid lines represent a case where the bias condition of the first-stage amplifier 12 is Ido>0.75 Idss, the broken lines represent a case where the bias condition is Ido=0.1 to 0.75 Idss and the dotted lines represent a case where the bias condition is Ido<0.1 Idss.

First, the conventional case (represented by the broken lines, where Ido=0.1 to 0.75 Idss) will be discussed.

It can be seen from FIG. 6(a) that the gain characteristic is not changed from that in the normal case represented by the solid lines and the phase characteristic is improved by distortion compensation with the first-stage amplifier 12. This shows that the distortion characteristic is improved with respect to the output power in a wide dynamic range as shown in FIG. 6(b).

In FIG. 6(b), representing the specification value by the horizontal alternate long and short dash line, it can be seen that an output operation level satisfying the distortion characteristic, which is represented by the vertical alternate long and short dash line, becomes larger.

Thus, by setting the idle current Ido of the first-stage amplifier 12 in a range from 0.1 to 0.75 Idss, distortion compensation improving only the phase characteristic can be achieved.

Next, the case of the first embodiment (represented by the dotted lines, where Ido<0.1 Idss) will be discussed.

It can be seen from FIG. 6(a) that the phase characteristic is improved by distortion compensation with the first-stage amplifier 12 like the case of Ido=0.1 to 0.75 Idss. As to the gain characteristic in the operation level, since the first-stage amplifier 12 has a characteristic of gain increase with respect to the output power, the inflection point where the gain near the operation level turns to decrease is shifted towards the side of larger output level as compared with the normal case represented by the solid line. Therefore, it is found that the gain characteristic is also improved by distortion compensation in operation level. In a smaller output level, however, the distortion in gain characteristic is conversely deteriorated because of the characteristic of gain increase.

Studying the distortion characteristic shown in FIG. 6(b) where the specification value on distortion characteristic is represented by horizontal alternate long and short dash line, it can be seen that the output operation level satisfying the distortion characteristic, which is represented by the vertical alternate long and short dash line, becomes larger than those in the normal case of Idss>0.75 Idss and the conventional case of Ido=0.1 to 0.75 Idss.

Therefore, it is found that the distortion is further compensated as compared with the conventional case. On the other hand, when the output level is smaller, the distortion characteristic satisfies the specification value although it is deteriorated as compared with the normal case. Thus, when the output level is smaller, by setting Ido<0.1 Idss as the bias condition of the first-stage amplifier, it is possible to perform distortion compensation not only on the phase characteristic but also on the gain characteristic and achieve a characteristic of low distortion.

Further, since this constitution requires no attenuator or the like and only the bias condition is changed in the same constitution as the normal multistage amplifier, a small-size distortion compensation circuit can be achieved. It is also possible to make use of the gains in the amplifiers of respective stages without reduction.

Furthermore, although the case where the low-distortion multistage amplifier of the first embodiment is a three-stage amplifier and only the first-stage amplifier has the bias condition of Ido<0.1 Idss has been discussed, the number of stages of the amplifier is not limit to three or the amplifier having the bias condition of Ido<0.1 Idss is not limited to the first-stage one and the same effect can be produced even when the above bias condition is set in a plurality of stages.

Second Embodiment

Although no particular reference is made to the gate width Wg1 of the transistor in the first-stage amplifier 12 in the first embodiment, the gate width Wg1 may be set as below with relation to the gate width Wg3 of the transistor in the last-stage amplifier 16:

$$Wg1 > 2.4 \times Wg3/(Gain2 \times Gain3)$$

Specific discussion will be made below.

The operation level of the first-stage amplifier 12 having the bias condition of Ido<0.1 Idss is set to a level with more backoff by about 3 dB as compared with that of the last-stage amplifier 16 like in the normal case.

When the bias condition is Ido<0.1 Idss, however, the saturation power decreases by about 1 dB as compared with the normal bias condition setting. For this reason, in order to maintain the same backoff as in the case of Ido>0.75 Idss in the first-stage amplifier 12 having the bias condition of Ido<0.1 Idss, it is necessary to use a transistor having a gate width larger than that used under the normal bias condition by about 1 dB.

When the gate width of the transistor in the last-stage amplifier 16 is Wg3, since the gain of the second-stage amplifier 14 and the follower is Gain2×Gain3, the gate width of the transistor in the first-stage amplifier 12 under the normal bias condition is expressed as Wg1>2×Wg3/(Gain2×Gain3) (3 dB is double). Therefore, when the bias condition is Ido<0.1 Idss, if the gate width is expressed as Wg1>2.4×Wg3/(Gain2×Gain3) which is obtained by multiplying the above relation by 1.2 (1 dB is 1.2-fold), the operation level of the first-stage amplifier 12 becomes a level having sufficient backoff and it is therefore possible to compensate the distortion of the last-stage amplifier 16 and improve the distortion characteristic.

This achieves a characteristic of lower distortion and can provide a multistage amplifier of high efficiency and low distortion. Further, since this constitution requires no attenuator or the like and only the bias condition is changed in the same constitution as the normal multistage amplifier, a small-size distortion compensation circuit can be achieved. It is also possible to make use of the gains in the amplifiers of respective stages without reduction.

Furthermore, although the case where the low-distortion multistage amplifier of the second embodiment is a three-stage amplifier and only the first-stage amplifier 12 has the bias condition of Ido<0.1 Idss and the gate width is Wg1>2.4×Wg3/(Gain2×Gain3) has been discussed, the number of stages of the amplifier is not limited to three or the amplifier having the above bias condition and the above gate width is not limited to the first-stage one and the same effect can be produced even when the above bias condition and the above gate width are set in a plurality of stages.

Industrial Applicability

Thus, the multistage amplifier of the present invention is suitable for use in satellite communications, terrestrial microwave communications, mobile communications and the like which require a large distortion compensation effect.

What is claimed is:

1. A multistage amplifier having a plurality of amplifiers connected in series to one another, wherein a bias condition of at least one amplifier among said amplifiers other than a last-stage amplifier is set so that an idle current is less than a tenth of a saturation current and the last-stage amplifier consists of one amplifier element having only one gate of a first width.

2. The multistage amplifier according to claim 1, wherein said amplifier whose bias condition is set such that said idle current is less than a tenth of said saturation current includes a further amplifying element having a gate with a second width that is set in such a manner that the first width and the second width satisfy a predetermined condition.

3. A multistage amplifier having a plurality of amplifiers connected in series to one another, wherein a bias condition of at least one amplifier among said amplifiers other than a last-stage amplifier is set so that an idle current is less than a tenth of a saturation current, with said at least one amplifier including a gate with a width and the last-stage amplifier also including a gate with a width such that:

when the gate width of said last-stage amplifier is Wgn, the gate width of an i-th amplifier selected as said at least one amplifier whose bias condition is set such that said idle current is less than a tenth of said saturation current is Wgi, and the gain of an (i+1)-th amplifier through said last-stage amplifier is G, the gate width of said i-th amplifier is so set as to satisfy the following relation:

$Wgi > 2.4 \times Wgn/G.$

* * * * *